United States Patent [19]
Park et al.

[11] Patent Number: 5,963,479
[45] Date of Patent: Oct. 5, 1999

[54] METHOD OF ERASING A FLASH MEMORY CELL AND DEVICE FOR ERASING THE SAME

[75] Inventors: Joo Weon Park, Seoul; Hyung Rae Park, Kyungki-Do, both of Rep. of Korea

[73] Assignee: Hyundai Electronics Industries, Co., Ltd., Kyungki-Do, Rep. of Korea

[21] Appl. No.: 08/998,316

[22] Filed: Dec. 24, 1997

[30] Foreign Application Priority Data

Dec. 28, 1996 [KR] Rep. of Korea ............... 96-74989
Dec. 28, 1996 [KR] Rep. of Korea ............... 96-74994

[51] Int. Cl.$^6$ ................................................ G11C 7/00
[52] U.S. Cl. ............... 365/185.29; 365/218; 365/185.33
[58] Field of Search ................ 365/185.01, 182.01, 365/218, 185.29, 185.33

[56] References Cited

U.S. PATENT DOCUMENTS

| | | |
|---|---|---|
| 5,416,738 | 5/1995 | Shrivastava . |
| 5,526,309 | 6/1996 | Jinbo ............................ 365/185.29 |
| 5,535,328 | 7/1996 | Harari et al. ................... 395/182.05 |
| 5,642,310 | 6/1997 | Song ............................. 365/185.29 |
| 5,650,965 | 7/1997 | Lee ............................... 365/185.29 |
| 5,677,868 | 10/1997 | Takahashi et al. ............... 365/218 |
| 5,734,611 | 3/1998 | Kim et al. ...................... 365/185.33 |
| 5,818,763 | 10/1998 | Villa et al. ..................... 365/185.29 |

*Primary Examiner*—Viet Q. Nguyen
*Attorney, Agent, or Firm*—Scott C. Harris, Esq.

[57] ABSTRACT

The present invention disclosed a method of erasing a flash memory comprising the step of applying a drain bias voltage for erasing to any one of said sectors; applying a drain bias voltage for erasing to a next sector before said sector is completely erased, whereby the sectors are erased sequentially.

5 Claims, 4 Drawing Sheets

METHOD OF ERASING A FLASH MEMORY CELL AND DEVICE FOR ERASING THE SAME

BACKGROUND OF THE INVENTION

1. Field of the Invention

The present invention relates to a flash memory. In particular, the present invention relates to a method of erasing of a flash memory and device for erasing the same which can reduce an erase operation time and a peak current by applying a first drain bias voltage for erase to a first sector of a flash EEPROM and then applying a second drain bias voltage for erase to a second sector thereof before the first sector is completely erased.

2. Description of the Prior Art

In a conventional method of erasing chip, the entire cells of the cell array divided into a plurality of sectors are selected simultaneously, and then a bias voltage is applied to each cell. This conventional method of erase has a disadvantage that an initial erase operation current is great. In particular, as the integration of a chip becomes more higher, the drain current Vd becomes greater due to a band to band tunneling phenomenon so that a voltage drops in a drain. As a result, an erase operation is affected by the voltage drop or a noise occurs. Also, a reliability of metal lines is degraded.

An another method is to sequentially erase the sectors, after one sector is completely erased, a next sector is selected and then an erase operation is performed again. In this case, an initial peak current may be reduced, however, a time to take an erase operation is too long since the erase operation is performed whenever sectors are changed.

The value of current Id shown in FIG. 3 shows a band to band tunneling current characteristics initially generating when a drain current Vd changes after a negative voltage is applied to a gate. In order to reduce a tunneling current, a dose is controlled so as to form a drain, but too much small band to band tunneling current has a direct effect on the erase characteristics.

SUMMARY OF THE INVENTION

It is an object of the present invention to provide a method of erasing a flash memory and device for erasing the same which can reduce an erase operation time and a peak current.

To achieve the above object, a method of erasing a flash memory cell according to the present invention comprises the steps of applying a drain bias voltage for erasing to a first sector of a memory cell array divided into a plurality of sectors; applying a drain bias voltage for erasing to a second sector before the first sector is completely erased; applying a drain bias voltage for erasing to a third sector before the second sector is completely erased; and applying a drain bias voltage for erasing to a next sector before the third sector is completely erased.

A device for erasing a flash memory cell of the present invention comprises a charge pump for applying a negative bias voltage to a sector of a plurality of sectors of a cell array through a Z-decoder, a drain bias voltage generating generator for generating a drain bias voltage, a means for supplying a drain bias voltage for erasing to the sectors sequentially. The means for supplying a drain bias voltage supplies to any one of the sectors and then supplies a drain bias voltage for erasing to a next sector before the former sector is completely erased.

BRIEF DESCRIPTION OF THE DRAWINGS

Other objects and advantages of the present invention will be understood by reading the detailed explanation of the embodiments with reference to the accompanying drawings in which.

DETAILED DESCRIPTION OF THE INVENTION

Below, the preferred embodiment of the present invention will be explained in detail by reference to the accompanying drawings.

Figure 1:
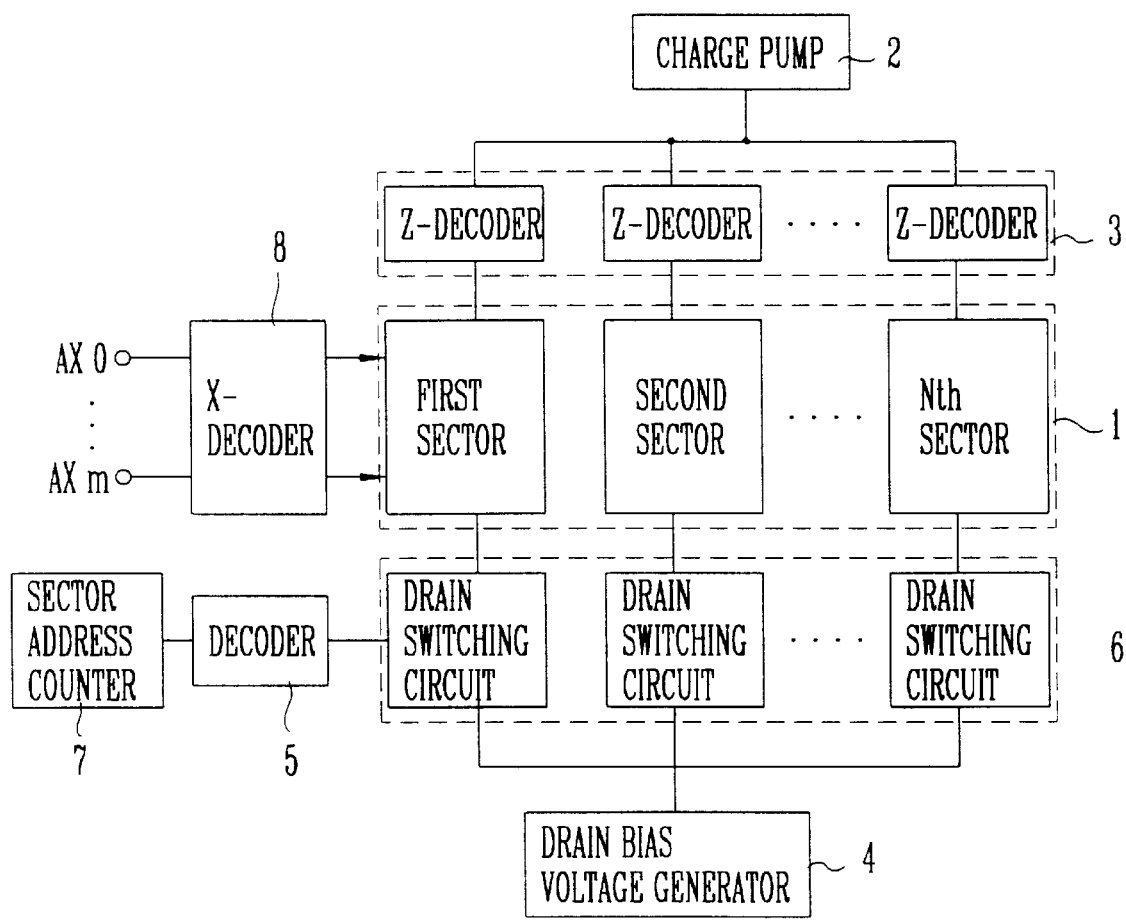
FIG. 1 illustrates a hardware configuration for explaining a method of erasing a flash memory cell according to the first embodiment of the present invention.

Referring to FIG. 1, a cell array 1 is consisted of a number of sectors. Each of the sectors is consisted of a number of cells and each of the cells includes a source, a drain, a floating gate, a control gate and a select gate. During an erase operation, a negative bias voltage from a charge pump 2 is applied to a control gate of each of the cells within the sectors through a Z-decoding means 3. A voltage supplied from a drain bias voltage generator 4 is applied to each drain through a drain switching means 6. The Z-decoding means 3 is consisted of a number of Z-decoders and the drain switching means 6 is consisted of a number of drain switching circuits. A number of the sectors can be sequentially selected by a X-decoder 8 and a number of drain switching circuits can be sequentially selected by an output signal of a decoder 5. The decoder 5 is controlled by an output signal of a sector address counter 7.

Figure 2:
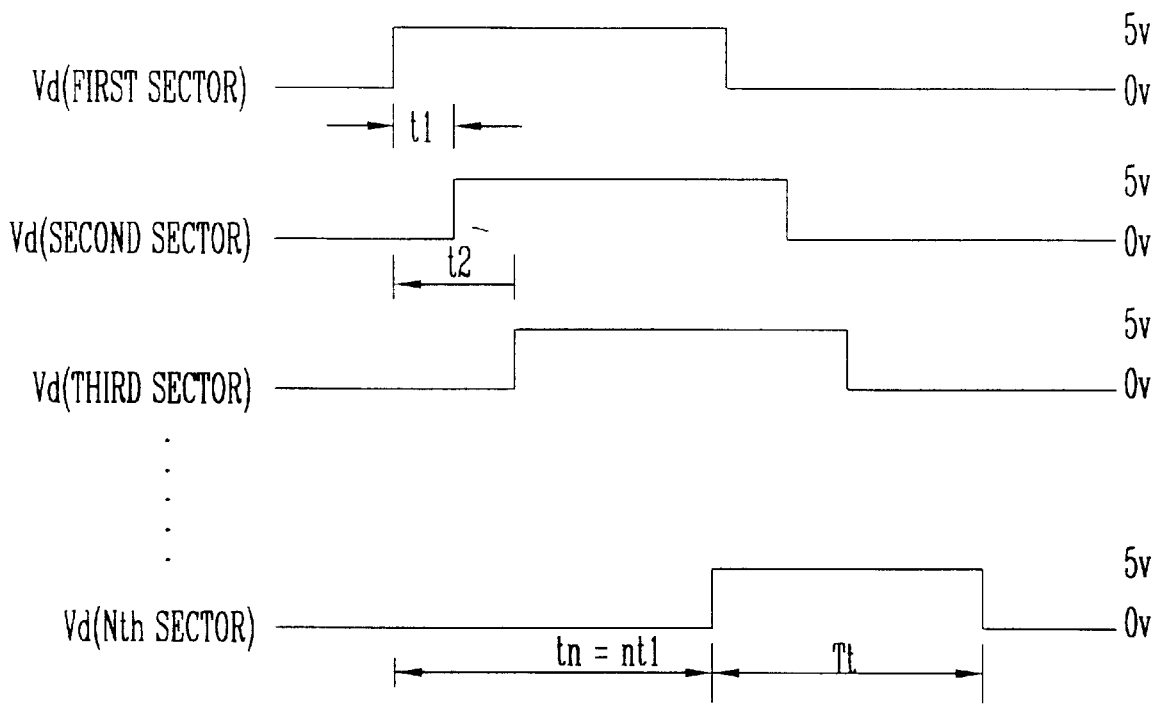
FIG. 2 is a timing chart shown to explain FIG. 1.
Figure 3:
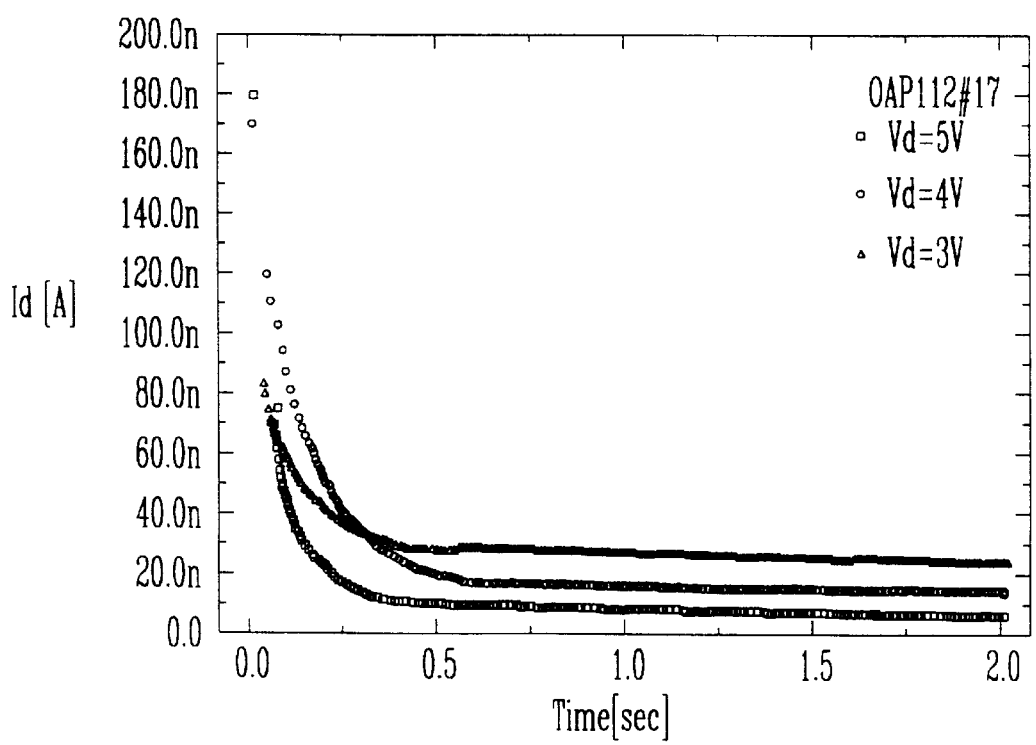
FIG. 3 is a voltage characteristic diagram according to the time, shown to explain a method of erasing a flash memory cell.

As shown in FIG. 2, a drain bias voltage is applied to each sector at a time interval. After a determined time t1 is elapsed from a beginning a applying the drain bias voltage to a first sector, a drain bias voltage is applied to a second sector. Although the applying time of drain bias voltage to the first to a Nth sector is different, the erase operation of the certain sector, for example, the second sector is performed simultaneously with the erase operation of the another adjacent sectors, for example, the first and third sectors during a given period of time. That is, before an erase operation of the first sector is completed, an erase operation of the second sector is begun. Next, before an erase operation of the second sector is completed, an erase operation of a third sector is begun. Finally, before an erase operation of the (N−1)th sector is completed, an erase operation of a Nth sector is begun FIG. 4 illustrates a hardware configuration shown to explain an erase method of a flash memory cell according to the second embodiment of the present invention.

Figure 4:
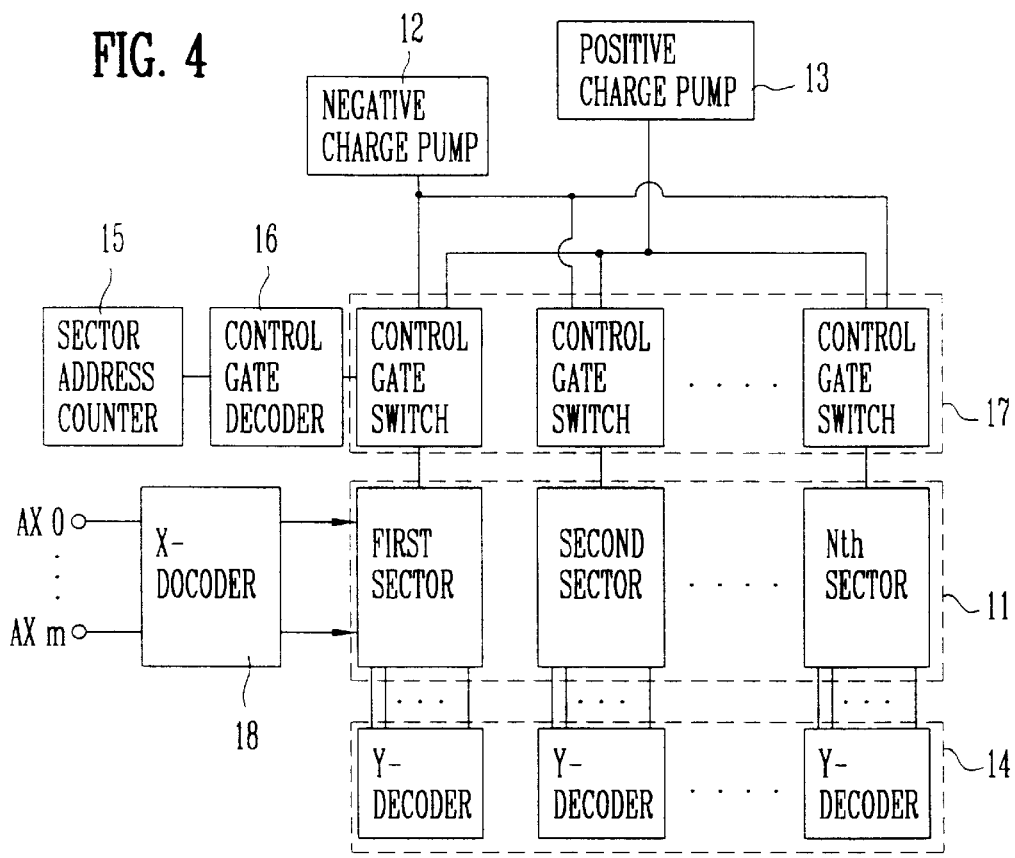
FIG. 4 illustrates a hardware configuration shown to explain a method of erasing a flash memory cell according to the second embodiment of the present invention.

In FIG. 4, a cell array is consisted of a number of sectors. Each sector is consisted of a number of cells, each cell includes a source, a drain, a floating gate, a control gate and a select gate. During an erase operation, a negative bias voltage from a negative charge pump 12 is applied to a control gate of the each cell within the sector through a control gate switching means 17. The control gate switching means 17 is consisted of a number of control gate switches. A number of the sectors can be sequentially selected by a X-decoder 18 and a Y-decoding means 14. The number of control gate switches can be sequentially selected by a control gate decoder 16. The control gate decoder 16 is controlled by an output signal of a sector address counter 17.

Figure 5:
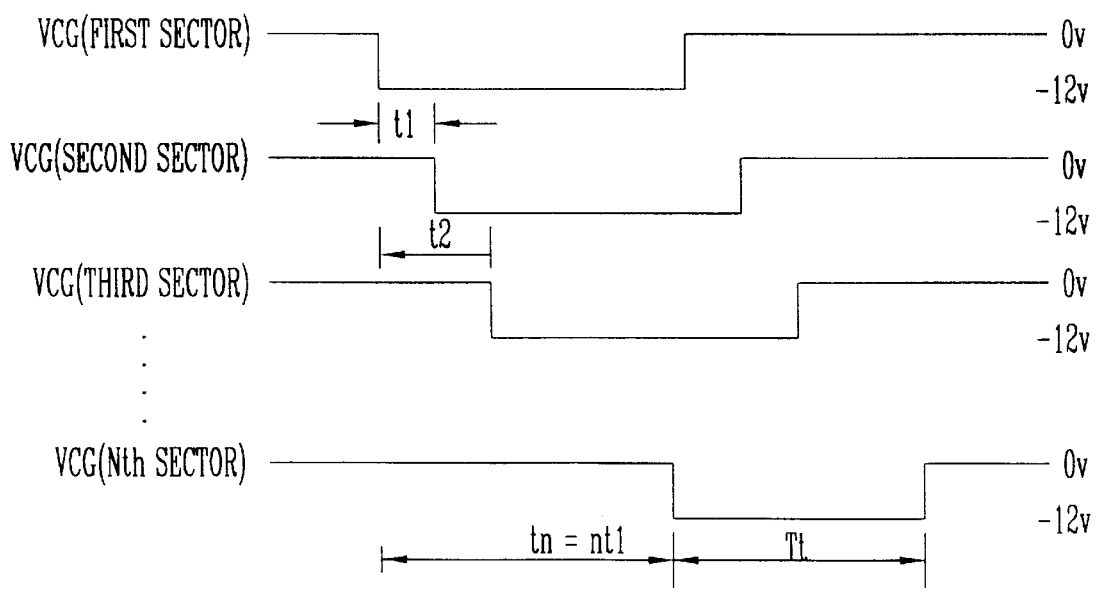
FIG. 5 is a timing chart shown to explain FIG. 4.
Figure 6:
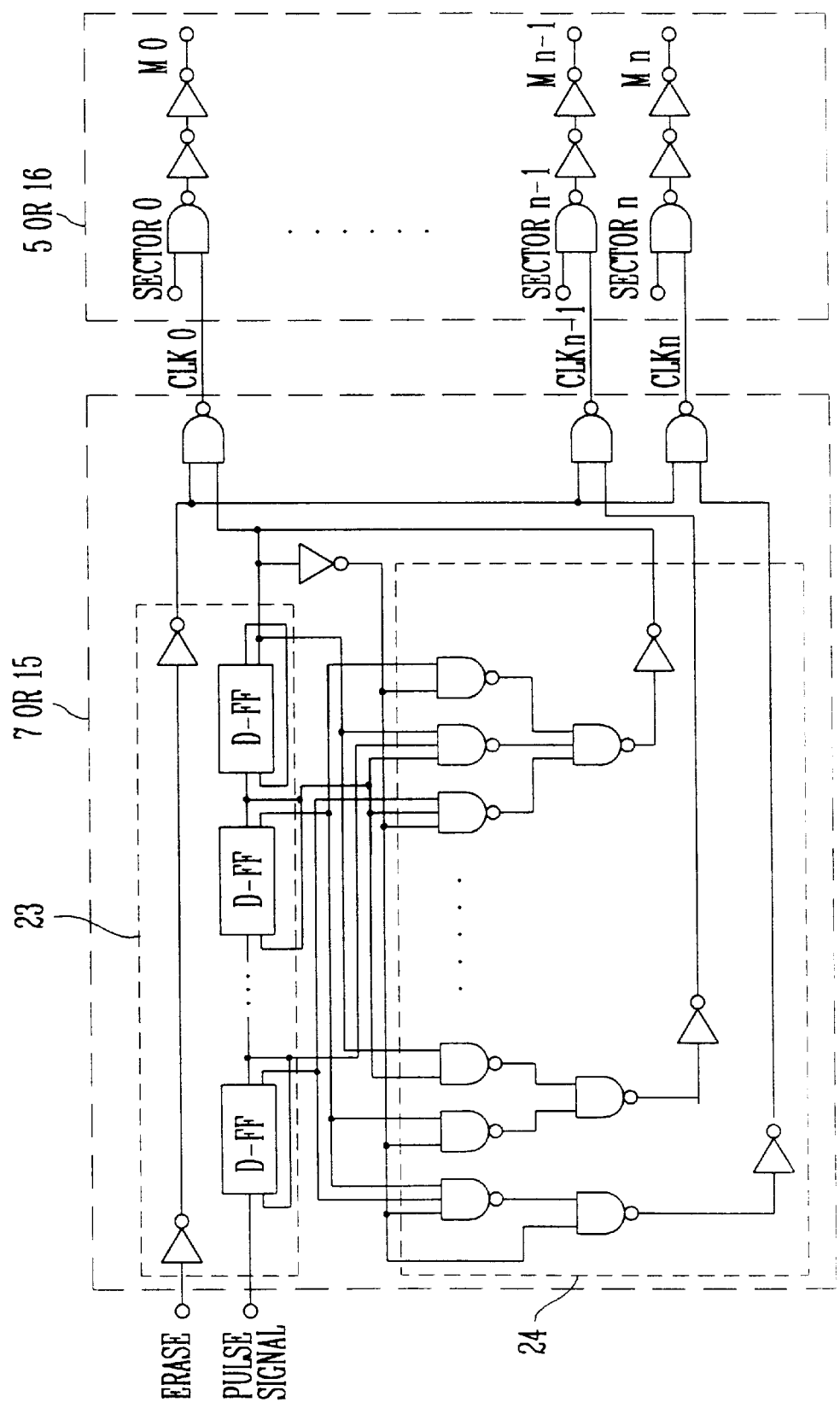
FIG. 6 is a circuit diagram of a sector address counter and a decoder used in the present invention.

As shown in FIG. 5, a control gate bias voltage is applied to each sector at a time interval. After a determined time t1 is elapsed from a beginning a applying the control gate bias voltage to a first sector, the control gate bias voltage is applied to a second sector. Although the applying time of the control gate bias voltage to the first to a Nth sector is different, the erase operation of the certain sector, for example, the second sector is performed simultaneously with the erase operation of the another adjacent sectors, for example, the first and third sectors during a given period of time. That is, before an erase operation of the first sector is completed, an erase operation of the second sector is begun. Next, before an erase operation of the second sector is completed, an erase operation of a third sector is begun. Finally, before an erase operation of the (N−1)th sector is completed, an erase operation of a Nth sector is begun FIG. 6 is a circuit diagram of the sector address counter and a decoder used in FIG. 1 and FIG. 4.

The sector address counter 7 or 15 generates a clock signal in order to control each sector so that the sectors can be biased sequentially biased with a bias time Tt in some delayed time t1 in response to an ERASE signal and a pulse signal as shown in FIG. 2 and FIG. 5.

Since the output signals CLK0 to CLKn of the sector address counter 7 control the decoder 5, the drain bias voltage is applied sequentially to the drain of cell through the drain switch circuit.

Also, since the output signals CLK0 to CLKn of the sector address counter 15 control the decoder 16, the negative gate bias voltage is applied sequentially to the control gate of cell through the control gate switch. At this time, the time to erase a chip is determined by the time Tt for biasing, a number of sector N and a delay time t1.

The sector address counter 7 or 15 includes a timer 23 consisted of a number of flipflops and a decoding circuit 24 for generating the clock signals CLK0 to CLKn, which are output signals having a given period of time Tt, after delay time t1.

As described above, the present invention can reduce an erase time and an initial peak current so that the voltage drop of drain of cell can be prevented and a time of erase can be shorten by applying a bias voltage for erasing to one sector and then applying overlappingly a bias voltage for erasing to a next sector after a given period of time.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of erasing a readable, writable and erasable flash memory cell, comprising the steps of;

applying a drain bias voltage for erasing to a first sector of a memory cell array divided into a plurality of sectors;

applying a drain bias voltage for erasing to a second sector before said first sector is completely erased;

applying a drain bias voltage for erasing to a third sector before said second sector is completely erased; and applying a drain bias voltage for erasing to a next sector before said third sector is completely erased, whereby said sectors are erased sequentially.

2. A method of erasing a readable, writable and erasable flash memory cell, comprising the steps of;

applying a drain bias voltage for erasing to any one sector of a memory cell array divided into a plurality of sectors; and applying a drain bias voltage for erasing to a next sector before said former sector is completely erased, whereby said sectors are erased sequentially.

3. A device for erasing a readable, writable and erasable flash memory cell, comprising:

a charge pump for applying a negative bias voltage to a sector of a plurality of sectors of a cell array through a Z-decoder;

a drain bias voltage generating generator for generating a drain bias voltage;

a means for supplying a drain bias voltage for erasing to said sectors sequentially, said means supplying a drain bias voltage to any one of said sectors and then supplying a drain bias voltage for erasing to a next sector before said sector is completely erased.

4. A method of erasing a readable, writable and erasable flash memory cell, comprising the steps of:

applying a negative bias voltage for erasing to any one sector of a memory cell array divided into a plurality of sectors; and applying a negative bias voltage for erasing to a next sector before said former sector is completely erased, whereby said sectors are erased sequentially.

5. A device for erasing a readable, writable and erasable flash memory cell, comprising:

a negative charge pump for applying a negative bias voltage to a sector of a plurality of sectors of a cell array;

a means for supplying a negative bias voltage for erasing to said sectors sequentially, said means supplying a negative bias voltage to any one of said sectors and then supplying a negative bias voltage for erasing to a next sector before said sector is completely erased.

* * * * *